United States Patent
Lee et al.

(10) Patent No.: US 7,075,854 B2
(45) Date of Patent: Jul. 11, 2006

(54) SEMICONDUCTOR MEMORY DEVICE, WRITE CONTROL CIRCUIT AND WRITE CONTROL METHOD FOR THE SAME

(75) Inventors: Sei-Hui Lee, Suwon-si (KR); Sang-Seok Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 32 days.

(21) Appl. No.: 10/927,142

(22) Filed: Aug. 27, 2004

(65) Prior Publication Data

US 2005/0117437 A1    Jun. 2, 2005

(30) Foreign Application Priority Data

Dec. 1, 2003    (KR) .................. 10-2003-0086288

(51) Int. Cl.
*G11C 8/00*    (2006.01)

(52) U.S. Cl. .................. 365/233; 365/190; 365/230.06

(58) Field of Classification Search ..................... None
See application file for complete search history.

(56) References Cited

U.S. PATENT DOCUMENTS

| | | | |
|---|---|---|---|
| 6,055,194 A * | 4/2000 | Seo et al. ................ 365/194 |
| 6,055,207 A * | 4/2000 | Nam .......................... 365/233 |
| 6,061,292 A * | 5/2000 | Su et al. ................ 365/230.06 |
| 6,061,295 A * | 5/2000 | Roh .......................... 365/233 |
| 6,064,622 A * | 5/2000 | Lee et al. ............. 365/230.06 |
| 6,151,270 A * | 11/2000 | Jeong ......................... 365/233 |
| 6,154,417 A * | 11/2000 | Kim ........................... 365/233 |
| 6,185,151 B1 * | 2/2001 | Cho ............................ 365/233 |
| 6,229,756 B1 * | 5/2001 | Jung et al. ............. 365/230.06 |
| 6,249,483 B1 * | 6/2001 | Kim ............................ 365/233 |
| 6,292,428 B1 * | 9/2001 | Tomita et al. .............. 365/233 |
| 6,333,892 B1 * | 12/2001 | Hamamoto et al. ..... 365/230.08 |
| 6,359,828 B1 * | 3/2002 | La .......................... 365/230.06 |
| 6,385,100 B1 * | 5/2002 | Noda et al. ............. 365/189.12 |
| 6,434,082 B1 | 8/2002 | Hovis et al. |
| 6,992,949 B1 * | 1/2006 | Chae et al. ............ 365/230.06 |

FOREIGN PATENT DOCUMENTS

| | | |
|---|---|---|
| JP | 2000-268565 | 9/2000 |
| KR | 1998-057449 | 9/1998 |
| KR | 2001-0003914 | 1/2001 |

* cited by examiner

*Primary Examiner*—Tan T. Nguyen
(74) *Attorney, Agent, or Firm*—Harness, Dickey & Pierce, P.L.C.

(57) ABSTRACT

A semiconductor memory device and a write control circuit which may detect write failures and a write control method for the same are provided. The semiconductor memory device may include a memory cell array, a bit line amplifier, a switch unit, and a write driver. Exemplary embodiments of the semiconductor memory device, according to the present invention, may determine the activation timing of the column select line signal using a clock enable signal and a mode register set signal, without synchronizing with a master clock signal.

20 Claims, 5 Drawing Sheets

SEMICONDUCTOR MEMORY DEVICE, WRITE CONTROL CIRCUIT AND WRITE CONTROL METHOD FOR THE SAME

BACKGROUND OF THE INVENTION

This application claims the priority of Korean Patent Application No. 10-2003-0086288 filed on Dec. 1, 2003 in the Korean Intellectual Property Office, the disclosure of which is incorporated herein in its entirety by reference.

1. Field of the Invention

The present invention relates to a semiconductor memory device, write control circuit and a write control method for the same. More particularly, exemplary embodiments of the present invention relate to a semiconductor memory device which may detect write failures and a write control method for the same.

2. Description of the Related Art

A synchronous semiconductor memory device, for example, a single data rate synchronous dynamic random access memory and/or a double data rate dynamic random access memory, may be synchronized with an external system clock which may improve the access time of semiconductor devices.

Data writing and/or reading may be controlled by a system clock signal which may be input from an external system. As the frequency of external system clocks may increase, the operating speed of a synchronous semiconductor memory device may also increase. A semiconductor testing apparatus for testing such high-speed devices may control the operation times.

After completing the fabrication processes of semiconductor memory devices, a semiconductor memory device test, in which various characteristics of each semiconductor memory device may be evaluated, may be performed before packaging, for example, performing a sawing process.

The semiconductor memory device test may be performed to detect defects which may occur in a fabrication process, for example, in a wafer level or a package level, such that defective products may be screened out.

When a fabrication defect may be detected and/or when the functions of the semiconductor memory device may not satisfy desired specifications, failure analysis may be executed to examine causes of failure, which may enhance the throughput of semiconductor memory devices.

The semiconductor memory device test may be performed in a plurality of ways. For example, direct current (DC) characteristics and/or alternating current (AC) characteristics of semiconductor memory devices may be measured using testing equipment. A voltage may be applied to each electrode of the semiconductor memory device to measure a current, and/or a current may be applied to measure a voltage, which may enable the evaluation of the stability of the power wiring, current consumption, leakage current, etc. in the semiconductor memory device.

In the semiconductor memory device test, a function test may be performed, which may test operations of writing data to and/or reading data from a memory cell.

To test a write operation of a semiconductor memory device, a write recovery time (referred to as tWR) may be defined, and various write failures (for example, a contact resistance failure of a column line select signal) may be detected during the tWR.

The tWR may be defined as a period of time from the beginning of a write operation of a semiconductor memory device to a timing when a read and/or write operation may be enabled. In other words, the tWR may be defined as a period of time from the beginning of the last data write to the receipt of a precharge command signal, that is, last data_in to row_precharge (Last data_in to row_precharge; Write Recovery Time).

The tWR may include a column select line (CSL) enable time, during which a CSL signal may be activated and valid write data may be applied to a bit line, and an active restore time, during which the CSL signal may be deactivated and valid write data may be stored in a memory cell until a word line may be precharged.

FIG. 1 is a block diagram illustrating an example of the control of a column select line signal in a related art semiconductor memory device.

As illustrated in the FIG. 1, column select line enable signal PCLKCD may be activated by an internal clock signal PCLK which may be generated from a master clock signal CLK and/or the write enable signal PWR. A column select line disable signal PCSLP may transition from a first logic state (for example, a 'high' logic state) to a second logic state (for example, a 'low' logic state) in response to the internal clock signal PCLK and/or a precharge enable signal.

When the column select line enable signal PCLKCD may be activated, the column line select signal CSL may be activated. When the column select line disable signal PCSLP may transition from the first logic state (for example, a 'high' logic state) to the second logic state (for example, a 'low' logic state), the column line select signal CSL may be deactivated.

The write enable signal PWR may be activated by a write command signal WRITE which may define a write operation among a plurality of input command signals. The precharge enable signal may be activated by a precharge command signal PRE which may define a precharge operation among the plurality of input command signals.

FIG. 2 is a diagram illustrating an example of a circuit which may provide the column select line signal CSL in a related art semiconductor memory device.

The circuit may include a first PMOS transistor MP1 which may receive the column select line enable signal PCLKCD, an NMOS transistor MN3 which may receive the column select line enable signal PCLKCD, a second PMOS transistor MP2 which may receive the column select line disable signal PCSLP and may be connected between the first PMOS transistor MP1 and the NMOS transistor MN3, a first inverter 51 which may be connected to a node where the second PMOS transistor MP2 and the NMOS transistor MN3 may be connected to each other, and a second inverter 52 which may be connected to the first inverter 51 in a latch configuration.

When the column select line enable signal PCLKCD may be activated, the first PMOS transistor MP1 may be turned off and the NMOS transistor MN3 may be turned on, such that an input terminal of the first inverter 51 may be electrically connected to an electrode (for example, a ground electrode). The input terminal of the first inverter 51 may be in a second logic state (for example, a 'low' logic state), and therefore the column line select signal CSL may be activated.

When the column select line disable signal PCSLP may be in a first logic state (for example, a 'high' state), the first PMOS transistor MP1 may be turned off and may not supply charges to the input terminal of the first inverter 51. When the column select line disable signal PCSLP may be in the second logic state (for example, a 'low' logic state) and the column select line enable signal PCLKCD may be in the second logic state (for example, a 'low' logic state), the first PMOS transistor MP1 and the second PMOS transistor MP2 may be turned on, and the NMOS transistor MN3 may be turned off. As a result, the input terminal of the first inverter 51 may be electrically connected to a power supply voltage electrode. Charges may be supplied to the input terminal of the first inverter 51, such that the input terminal of the first inverter 51 may be in the first logic state (for example, a 'high' state) and the column line select signal CSL may be deactivated.

Since the second inverter 52 may be connected to the first inverter 51 in a latch configuration, the column line select signal CSL may not float due to charge sharing at the node where the second PMOS transistor MP2 and the NMOS transistor MN3 may be connected to each other. When a signal may float, it may not be determined whether the signal may be in the first logic state (for example, a 'high' state) or the second logic state (for example, a 'low' logic state).

For synchronous semiconductor devices, the tWR may be expressed by the number of clock cycles, for example, tWR=2 clock cycles, or tWR=3 clock cycles. High-speed synchronous semiconductor memory devices may have a tWR of a few clock cycles.

To test a write operation of a high-speed synchronous semiconductor memory device which may have a tWR of a few clock cycles, the test may need to be performed at the same, or substantially the same frequency as the write frequency of the high-speed synchronous semiconductor memory device which may be used to examine a state of the write operation.

Considering the fact that progress may be being made in this field, it may not be cost-effective to develop testing equipment every time progress may be made. Therefore, it may be economical to use related art testing equipment which may be used to detect write failures in a write operation test.

A problem with the related art write control method which may be used for the write operation test may be that write failures may not be accurately detected, and the throughput of semiconductor memory devices may not be increased.

SUMMARY OF THE INVENTION

Exemplary embodiments of the present invention may provide a semiconductor memory device which may adjust an activation timing of a column line select signal which may be used to detect write failures.

Exemplary embodiments of the present invention may also provide a write control method for a semiconductor memory device which may adjust an activation timing of a column line select signal which may be used to detect write failures.

Exemplary embodiments of the present invention may provide a write control circuit which may adjust an activation timing of a column line select signal which may be used to detect write failures.

Exemplary embodiments of the present invention may also provide testing equipment adapted to increase the write operation speed of a synchronous semiconductor device through adjustment of the activation timing of a column line select signal.

An exemplary embodiment of the present invention provides a semiconductor memory device which may include a memory cell array, a bit line amplifier which may amplify a difference between a voltage of a bit line and a voltage of a complementary bit line in the memory cell array, a switch unit which may be activated by a column select line signal and may electrically connect a data line to the bit line and a complementary data line to the complementary bit line, and a write driver which may be activated by a write enable signal, may provide write data voltage to the data line and the complementary data line, and may be in synchronization with a master clock signal, wherein a clock enable signal and a mode register may set signal determine an activation timing of the column select line signal.

The column select line signal may be activated by a column select line enable signal and may be deactivated by a column select line disable signal which may be provided by performing a NAND operation on the clock enable signal and the mode register set signal.

Another exemplary embodiment of the present invention provides a write control method for a semiconductor memory device which may comprise activating the column select line signal, which may use a column select line enable signal, and deactivating the column select line signal, which may use a column select line disable signal, wherein a clock enable signal and a mode register set signal may determine an activation timing of the column select line signal.

In exemplary embodiments of the control method, according to the present invention, the column select line disable signal may be provided by performing a NAND operation on the clock enable signal and the mode register set signal.

Another exemplary embodiment of the present invention provides a write control circuit which may control an activation timing of a column select line enable signal based on at least one of a clock enable signal and/or a mode register set signal. The activation timing may not be synchronized with a master clock signal, and may be controlled by a NAND operation performed on at least one of a clock enable signal and/or a mode register set signal.

Another exemplary embodiment of the present invention provides a write control method which may comprise determining an activation timing of a column select line enable signal based on at least one of a clock enable signal and/or a mode register set signal. The activation timing may not be synchronized with a master clock signal, and may be controlled by performing a NAND operation on at least one of a clock enable signal and/or a mode register set signal.

Another exemplary embodiment of the present invention provides a write control circuit. Exemplary embodiments of the write control circuit may include a first circuit element, which may receive at least one input signal and may produce a first output signal, a second circuit element, which may receive the first output signal and may produce a second output signal, a third circuit element, which may receive the first output signal and may produce a third output signal, and a fourth circuit element. The fourth circuit element may perform a first NAND operation on a mode register select signal and a clock enable signal and may produce a fourth output signal. The third circuit element may perform a second NAND operation on the first output signal, the output of the fourth circuit element, and/or a write enable signal to produce the third output signal. A third NAND operation may be performed on the second output signal and the third output signal and may produce at least one of a column line select enable signal and/or a column line select disable signal.

The first circuit element may receive an internal clock signal and/or an address signal and may perform a fourth NAND operation on the internal clock signal and the address signal.

The second circuit element may perform a fifth NAND operation on the first output signal and a write enable signal.

Another exemplary embodiment of the present invention provides a write control method which may comprise receiving at least one input signal at a first circuit element which may produce a first output signal, receiving the first output signal at a second circuit element which may produce a second output signal, receiving the first output signal at a third circuit element which may produce a third output signal, producing a fourth output signal at a fourth circuit element which may be based upon a mode register select signal and/or a clock enable signal, and performing a first NAND operation on the first output signal, the output of the fourth circuit element, and/or a write enable signal which may produce the third output signal. A second NAND operation may be performed on the second output signal and/or the third output signal which may produce at least one of a column line select enable signal and/or a column line select disable signal.

Exemplary embodiments of the write control method may further comprise, receiving and performing a third NAND operation an internal clock signal and/or an address signal at the first circuit element.

Exemplary embodiments of the write control method may further comprise performing a fourth NAND operation on the first output signal and/or a write enable signal at the second circuit element.

Exemplary embodiments of the write control method may further comprise performing a fifth NAND operation on at least one of a clock enable signal and a mode register set signal to control the fourth output signal.

BRIEF DESCRIPTION OF THE DRAWINGS

The exemplary embodiments of the present invention may become more apparent by describing in detail exemplary embodiments thereof with reference to the attached drawings in which.

DETAILED DESCRIPTION OF THE EXEMPLARY EMBODIMENTS OF THE PRESENT INVENTION

The present invention will be described more fully with reference to the accompanying drawings, in which exemplary embodiments of the invention are shown. It should be understood, however, that exemplary embodiments of the present invention described herein can be modified in form and detail without departing from the spirit and scope of the invention. Accordingly, the exemplary embodiments described herein are provided by way of example and not of limitation, and the scope of the present invention is not restricted to the particular embodiments described herein.

Figure 1:
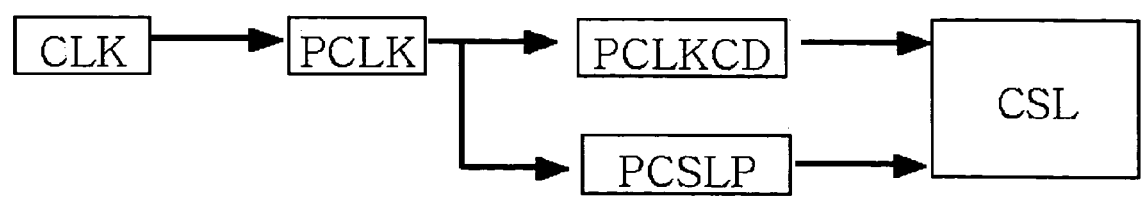
FIG. 1 is a block diagram illustrating control of a column select line signal in a related art semiconductor memory device.
Figure 2:
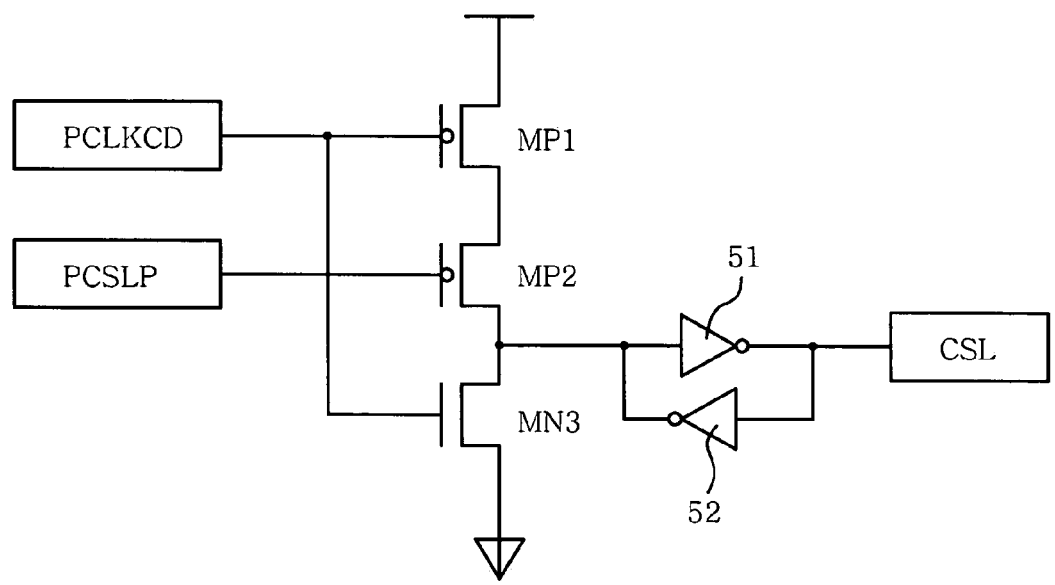
FIG. 2 is a diagram illustrating an example of a circuit which may provide a column select line signal in a related art semiconductor memory device.
Figure 3:
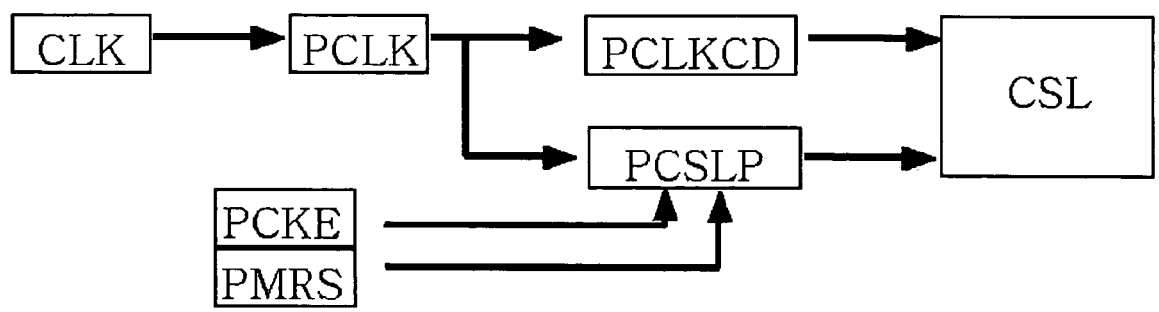
FIG. 3 is a block diagram illustrating an example of the control of a column select line signal in a semiconductor memory device according to exemplary embodiments of the present invention.

FIG. 3 is a block diagram illustrating an example of the control of the column select line signal CSL in a semiconductor memory device according to exemplary embodiments of the present invention.

The column select line enable signal PCLKCD may be activated by the internal clock signal PCLK and/or the write enable signal PWR. The column select line disable signal PCSLP may transition from the first logic state (for example, a 'high' logic state) to the second logic state (for example, a 'low' logic state) in response to a clock enable signal PCKE, which may be input every time the state transition of the master clock signal CLK may occur, and a mode register set signal PMRS, which may set a write cycle mode.

When the column select line enable signal PCLKCD may be activated, the column line select signal CSL may be activated. When the column select line disable signal PCSLP may transition from the first logic state (for example, a 'high' logic state) to the second logic state (for example, a 'low' logic state), the column line select signal CSL may be deactivated.

The clock enable signal PCKE in the first logic state (for example, a 'high' logic state) may be input every time the master clock signal CLK may transition from the second logic state (for example, a 'low' logic state) to the first logic state (for example, a 'high' logic state) and may activate the internal clock signal PCLK. If the clock enable signal PCKE remains in the second logic state (for example, a 'low' logic state) when the master clock signal CLK may transition from the second logic state (for example, a 'low' logic state) to the first logic state (for example, a 'high' logic state), the internal clock signal PCLK stops, all of the other input signals may be ignored, and the semiconductor memory device may enter a power down mode and/or a self-refresh mode.

The clock enable signal PCKE may be input every time the master clock signal CLK may transition from a first logic state (for example, 'high') to a second logic state (for example, 'low').

The mode register set signal PMRS may be used to set various options (for example, a CAS latency, a burst type, and a burst length) and may be used to control various operating modes of a semiconductor memory device. The mode register set signal PMRS may set the write cycle mode when the semiconductor memory device may perform a write operation.

In a semiconductor memory device according to exemplary embodiments of the present invention, a deactivation timing of the column line select signal CSL may be determined by the clock enable signal PCKE and/or the mode register set signal PMRS. The column line select signal CSL may be deactivated without being synchronized with the master clock signal CLK. The timing when the column line select signal CSL may be activated may be adjusted by adjusting the clock enable signal PCKE and/or the mode register set signal PMRS.

Figure 4:
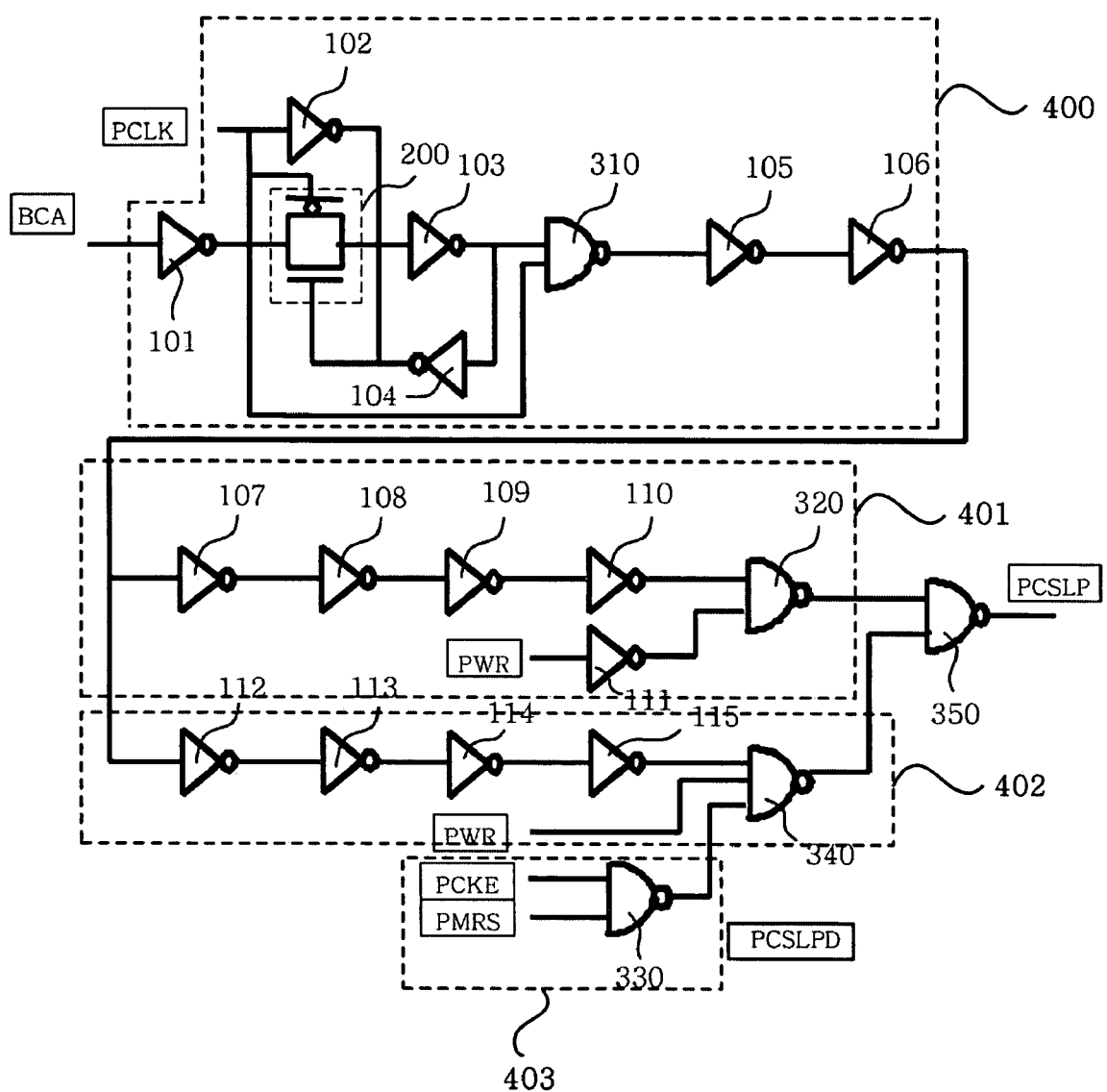
FIG. 4 is a diagram illustrating an example of a write control circuit of a semiconductor memory device according to an exemplary embodiment of the present invention.

FIG. 4 is a diagram illustrating a write control circuit of a semiconductor memory device according to an exemplary embodiment of the present invention. The write control circuit may include circuit elements 400–403. When an address signal BCA, which may select one among a plurality of memory cells, and the internal clock signal PCLK may be activated to the first logic state (for example, a 'high' logic state) in response to the clock enable signal PCKE, a signal output from a first NAND gate 310, which may receive the internal clock signal PCLK and an inverted signal of the address signal BCA, may remain in the first logic state (for example, a 'high' logic state).

The signal output from the first NAND gate 310 may be transmitted to a second NAND gate 320 through an even number of inverters 105 through 110 which may be connected in series. The second NAND gate 320 may also receive an inverted signal of the write enable signal PWR. When the write enable signal PWR may be activated, the second NAND gate 320 may output a signal in the first logic state (for example, a 'high' logic state).

The signal output from the first NAND gate 310 may be transmitted to a third NAND gate 340 through an even number of inverters 105, 106, and 112 through 115, which may be connected in series. The third NAND gate 340 may also receive the write enable signal PWR and a signal output from a fourth NAND gate 330, which may receive the clock enable signal PCKE and the mode register set signal PMRS.

When the write enable signal PWR may be activated and/or the clock enable signal PCKE and the mode register set signal PMRS may be activated such that the signal output from the fourth NAND gate 330 may remain in the second logic state (for example, a 'low' logic state), a signal output from the third NAND gate 340 remain in the first logic state (for example, a 'high' logic state).

The signal output from the second NAND gate 320 and the signal PCSLPD output from the third NAND gate 340 may be input to a fifth NAND gate 350, which may provide the column select line disable signal PCSLP. Accordingly, the column select line disable signal PCSLP may remain in the second logic state (for example, a 'low' logic state). The column select line disable signal PCSLP may be provided by performing a NAND operation on the clock enable signal PCKE and the mode register set signal PMRS.

Figure 5:
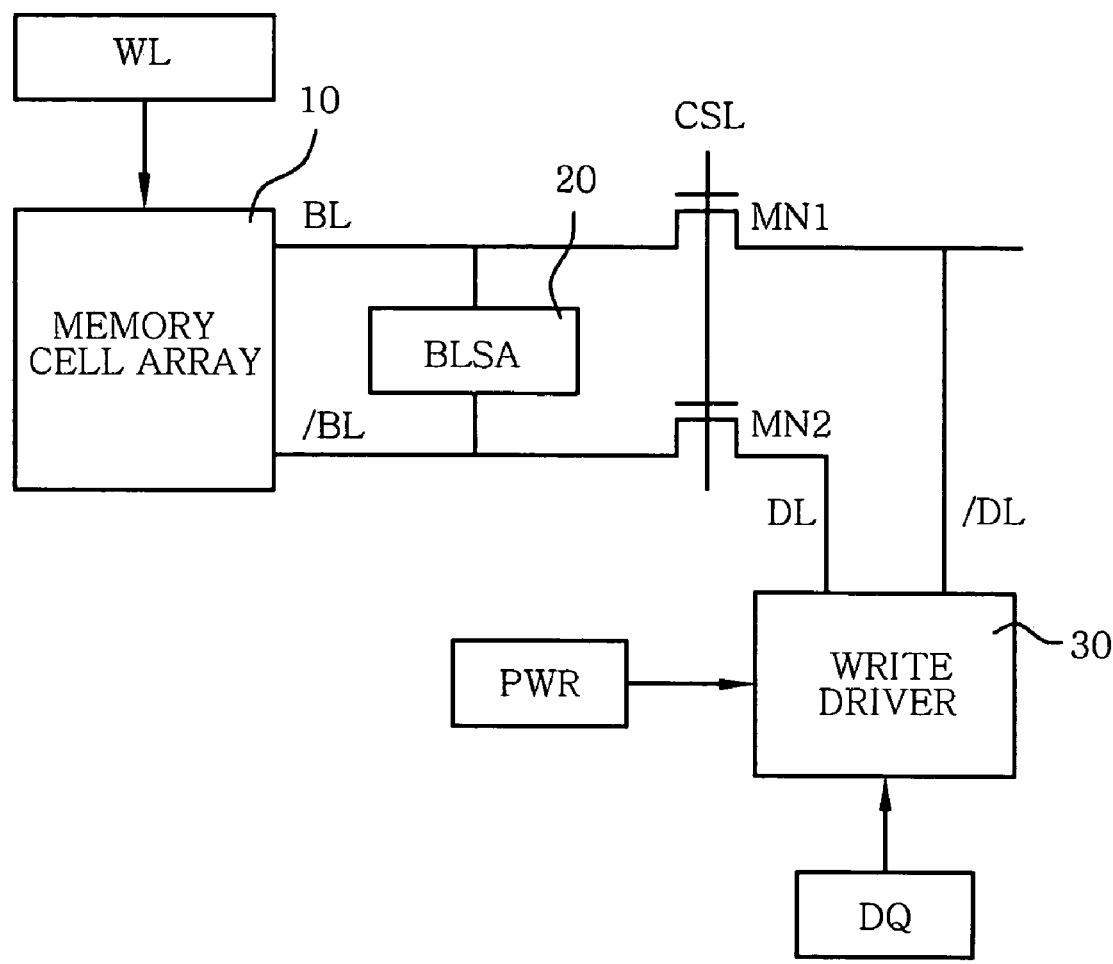
FIG. 5 is a block diagram of an exemplary embodiment of a semiconductor memory device according to the present invention.

As illustrated in FIG. 5, a semiconductor memory device may include a memory cell array 10, which may include a plurality of memory cells arranged in rows and columns, a bit line sensing amplifier (BLSA) 20, which may amplify a difference between a voltage of a bit line (BL) and a voltage of a complementary bit line (/BL) in the memory cell array 10, switches MN1 and MN2 which may electrically connect a data line (DL) to the BL and a complementary data line (/DL) to the /BL, and a write driver 30, which may provide write data (DQ) voltage to the DL and the /DL.

A word line may be activated by a word line signal WL, and the BL and memory cell in the memory cell array 10 may be electrically conductive, such that the write data (DQ) voltage, which may be provided by the write driver 30, may be transmitted to the memory cell through the BL and data may be written.

The write data (DQ) voltage may be transmitted to the BL by the write driver 30, and the BLSA 20 may amplify a voltage difference between a voltage of the BL and a voltage of the /BL which may provide an amplified voltage difference to the BL.

The switches MN1 and MN2 may be activated by a column select line signal CSL and may electrically connect the BL to the DL and the /BL to the /DL.

The write driver 30 may be activated by a write enable signal PWR which may provide the write data (DQ) voltage, which may be input in synchronization with a master clock signal, to the DL and the /DL.

Figure 6:
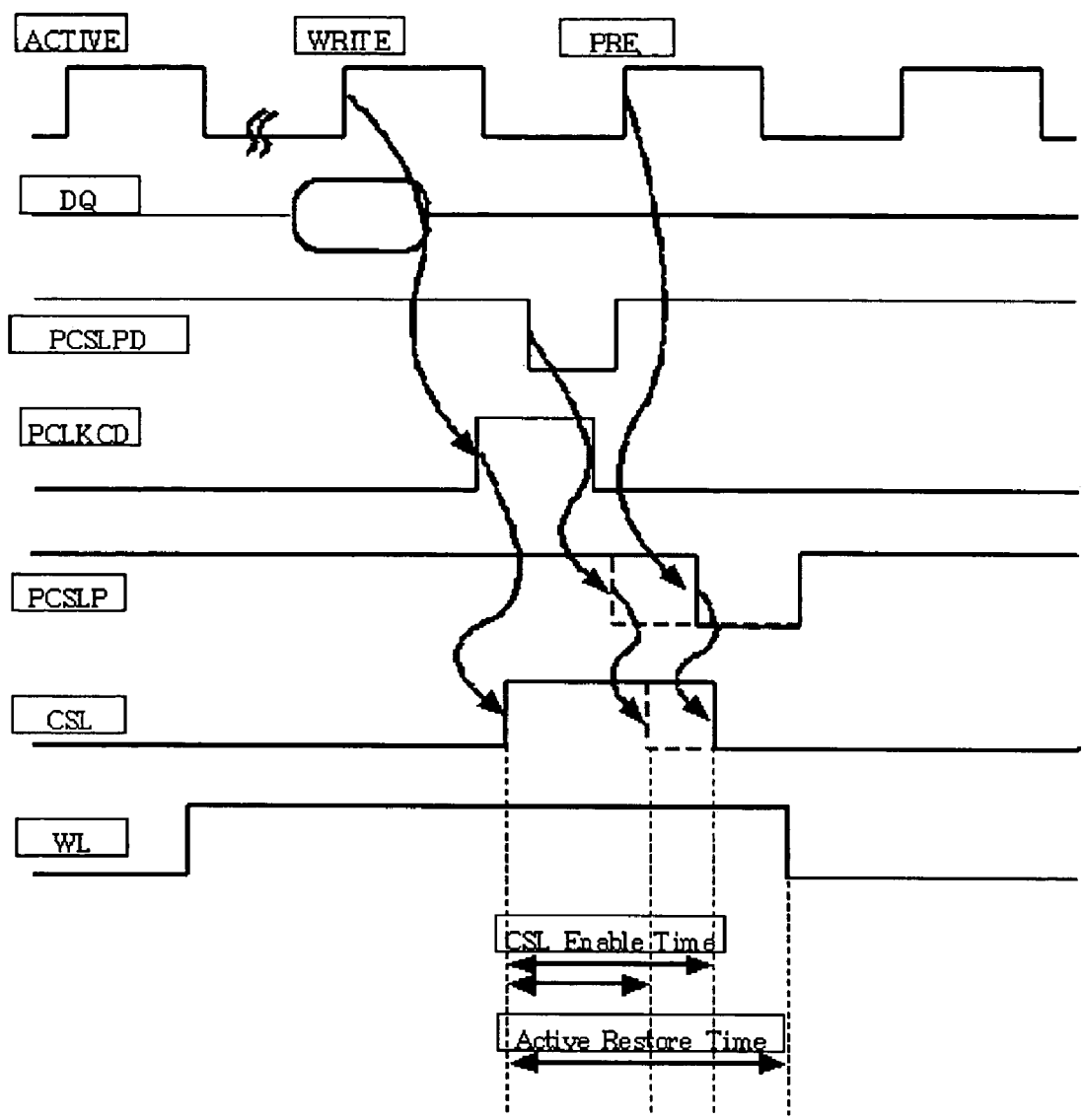
FIG. 6 is a timing diagram of an example of a write operation of a semiconductor memory device according to an exemplary embodiment of the present invention.

FIG. 6 is a timing diagram of a write operation of a semiconductor memory device according to an exemplary embodiment of the present invention in which a burst length may be one and the tWR may be 1 clock cycle. In this exemplary embodiment of the present invention, the semiconductor memory device may be set to an active operation mode when it may receive an active command signal ACTIVE, and a word line signal WL may be activated. The word line signal WL may be deactivated by the precharge command signal PRE.

When the write command signal WRITE may be input together with the write data DQ, the write enable signal PWR may be activated, and the column select line enable signal PCLKCD may be activated in response to the activation of the write enable signal PWR.

When the signal PCSLPD obtained by performing a NAND operation on the clock enable signal PCKE and the mode register set signal PMRS may transition from the first logic state (for example, a 'high' logic state) to the second logic state (for example, a 'low' logic state), the column select line disable signal PCSLP may also transition from the first logic state (for example, a 'high' logic state) to the second logic state (for example, a 'low' logic state).

When the column select line enable signal PCLKCD may be activated, the column line select signal CSL may also be activated. When the column select line disable signal PCSLP may transition from the first logic state (for example, a 'high' logic state) to the second logic state (for example, a 'low' logic state), the column line select signal CSL may be deactivated.

When the column line select signal CSL may be activated, the BL and the /BL may be electrically connected to the DL and the /DL, respectively.

The write driver 30 may be activated by the write enable signal PWR and may provide the write data DQ to the DL and the /DL.

While the column line select signal CSL may be being activated, the write data DQ may be provided to the BL and the /BL by the write driver 30.

During the active restore time, from the timing when the column line select signal CSL may be activated to the timing when the word line signal WL may be deactivated, the write data DQ may be transmitted to a memory cell by the BLSA 20.

In exemplary embodiment of the present invention, the semiconductor memory device may adjust the timing when the column select line disable signal PCSLP may transition from the first logic state (for example, a 'high' logic state) to the second logic state (for example, a 'low' logic state) which may use the clock enable signal PCKE and the mode register set signal PMRS, and may adjust the CSL enable time when the column line select signal CSL may be activated.

Accordingly, fabrication failures (for example, a contact resistance failure of a column line select signal) which may relate to the column line select signal CSL may be detected, such that reliability of the write operation of the semiconductor memory device may be increased.

Although exemplary embodiments of the present invention have been described as utilizing a first logic state (for example, a 'high' logic state), and a second logic state (for example, 'low' logic state), it will be understood that any logic state may be utilized within exemplary embodiments of the present invention as may be desired by one of ordinary skill in the art.

Although exemplary embodiments of the present invention have been described as utilizing PMOS and NMOS transistors, it will be understood that the PMOS and NMOS transistors may be used interchangeably, and further that any transistor may be used as desired by one of ordinary skill in the art.

Although only exemplary embodiments of the present invention have been shown and described with reference to the attached drawings, it will be understood by those skilled in the art that changes may be made to these embodiments without departing from the features and spirit of the invention. Therefore, it is to be understood that the above-described embodiments have been provided only in a descriptive sense and will not be construed as placing any limitation on the scope of the invention.

As described above, exemplary embodiments of the present invention may provide a write control circuit and method for the same which may increase the write operation speed in related art semiconductor memory devices. As described above, the present invention may provide a semiconductor memory device which may detect a write failure by detecting and/or adjusting an activation timing of a column line select signal. In addition, the present invention may provide a write control method for the semiconductor memory device which may detect a write failure by detecting and/or adjusting an activation timing of a column line select signal.

What is claimed is:

1. A semiconductor memory device comprising:
   a memory cell array;
   a bit line amplifier amplifying a voltage difference between a bit line and a complementary bit line in the memory cell array;
   a switch unit, activated by a column select line signal, which electrically connect a data line to a bit line and a complementary data line to a complementary bit line; and
   a write driver, activated by a write enable signal, which provides write data voltage to the data line and the complementary data line in synchronization with a master clock signal, wherein
      at least one of a clock enable signal and a mode register set signal determine an activation timing of the column select line signal.

2. The semiconductor memory device of claim 1, wherein the column select line signal is activated by a column select line enable signal and deactivated by a column select line disable signal provided by performing a NAND operation on the clock enable signal and the mode register set signal.

3. A write control method for a semiconductor memory device comprising:
   activating a column select line signal using a column select line enable signal;
   deactivating the column select line signal using a column select line disable signal; and
   determining an activation timing of the column select line signal based on at least one of a clock enable signal and a mode register set signal.

4. The write control method of claim 3, further comprising,
   providing the column select line disable signal by performing a NAND operation on the clock enable signal and the mode register set signal.

5. A semiconductor memory device for implementing the write control method of claim 3.

6. A write control circuit for implementing the write control method of claim 3.

7. A write control circuit which controls an activation timing of a column select line signal based on at least one of a clock enable signal and a mode register set signal and without synchronization with a master clock signal.

8. The write control circuit of claim 7, wherein the activation timing of the column select line signal is controlled by a NAND operation performed on at least one of a clock enable signal and a mode register set signal.

9. A write control method comprising:
   determining an activation timing of a column select line signal based on at least one of a clock enable signal and a mode register set signal and without synchronization with a master clock signal.

10. The write control method of claim 9 wherein determining the activation timing of the column select line signal further comprises,
    performing a NAND operation on at least one of a clock enable signal and a mode register set signal.

11. A write control circuit comprising:
    a first circuit element receiving at least one input signal and producing a first output signal;
    a second circuit element receiving the first output signal and producing a second output signal;
    a third circuit element receiving the first output signal and producing a third output signal; and
    a fourth circuit element which produces a fourth output signal based upon a performs a mode register select signal and a clock enable signal; wherein
       the third circuit element performs a first NAND operation on the first output signal, the output of the fourth circuit element, and a write enable signal to produce the third output signal, and
       a second NAND operation is performed on the second output signal and the third output signal producing at least one of a column line select enable signal or a column line select disable signal.

12. The write control circuit of claim 11, wherein the first circuit element receives an internal clock signal and an address signal and performs a third NAND operation on the internal clock signal and the address signal.

13. The write control circuit of claim 11, wherein the second circuit element performs a fourth NAND operation on the first output signal and a write enable signal.

14. The write control circuit of claim 11, the fourth output signal is controlled by a fifth NAND operation performed on at least one of a clock enable signal and a mode register set signal.

15. A semiconductor memory device including the write control circuit of claim 11.

16. A write control method comprising:
    receiving at least one input signal at a first circuit element and producing a first output signal;
    receiving the first output signal at a second circuit element and producing a second output signal;
    receiving the first output signal at a third circuit element and producing a third output signal; and
    producing a fourth output signal at a fourth circuit element based upon a mode register select signal and a clock enable signal;
    performing a first NAND operation on the first output signal, the output of the fourth circuit element, and a write enable signal to produce the third output signal; and
    performing a second NAND operation on the second output signal and the third output signal producing at least one of a column line select enable signal or a column line select disable signal.

17. The write control method of claim 16, further comprising,
    receiving and performing a third NAND operation an internal clock signal and an address signal at the first circuit element.

18. The write control method of claim 16, further comprising,
    performing a fourth NAND operation on the first output signal and a write enable signal at the second circuit element.

19. The write control method of claim 16, further comprising,
    performing a fifth NAND operation on at least one of a clock enable signal and a mode register set signal to control the fourth output signal.

20. A semiconductor memory device for implementing the write control method of claim 16.

* * * * *